United States Patent [19]

Clark et al.

[11] 4,211,999
[45] Jul. 8, 1980

[54] CONVERTER FOR CONVERTING A HIGH FREQUENCY VIDEO SIGNAL TO A DIGITAL SIGNAL

[75] Inventors: Ronald L. Clark, Indianapolis; John L. Kreeger, Cumberland, both of Ind.

[73] Assignee: The United States of America as represented by the Secretary of the Navy, Washington, D.C.

[21] Appl. No.: 854,455

[22] Filed: Nov. 23, 1977

[51] Int. Cl.² .......................................... H03K 13/175
[52] U.S. Cl. ......................... 340/347 AD; 340/347 M
[58] Field of Search .................. 340/347 M, 347 AD; 307/289

[56] References Cited

U.S. PATENT DOCUMENTS

| | | | |
|---|---|---|---|
| 3,582,777 | 6/1971 | Wunderman | 340/347 NT |
| 3,597,761 | 8/1971 | Fraschilla et al. | 340/347 M |
| 3,611,350 | 10/1971 | Liebowitz et al. | 340/347 AD |
| 3,728,560 | 4/1973 | Treadway | 307/289 |
| 3,806,915 | 4/1974 | Higgins et al. | 340/347 AD |
| 3,829,853 | 8/1974 | Freedman | 340/347 AD |
| 4,069,479 | 1/1978 | Carpenter | 340/347 AD |
| 4,143,366 | 3/1979 | Lewis | 340/347 AD |

OTHER PUBLICATIONS

The Engineering Staff of Analog Devices, Inc., Analog-Digital Conversion Handbook, 1972, pp. II-10 to 12.
Nordstrom, High-Speed Integrated A/D Converter, 1976 IEEE International Solid-State Circuits Conference, p. 15.

*Primary Examiner*—Thomas J. Sloyan
*Attorney, Agent, or Firm*—R. S. Sciascia; Paul S. Collignon

[57] ABSTRACT

A converter for converting a high frequency video input signal to a digital signal by detecting the peak voltages of the input signal. A video input signal fans out to a plurality of comparators of which each are connected to a resistive ladder of equal resistors values. One end of the resistive ladder is connected with a positive reference voltage and the other end is connected with a negative reference voltage. Real time is divided into sampling bins determined by the cycle time of a clock and, within each bin, the digital output from a plurality of master-slave flip-flops shows the maximum level reached by the video input signal. The outputs from the flip-flops go to a pair of priority encoders and a multiplexer for indicating in digital form the highest point reached on the resistive ladder.

7 Claims, 5 Drawing Figures

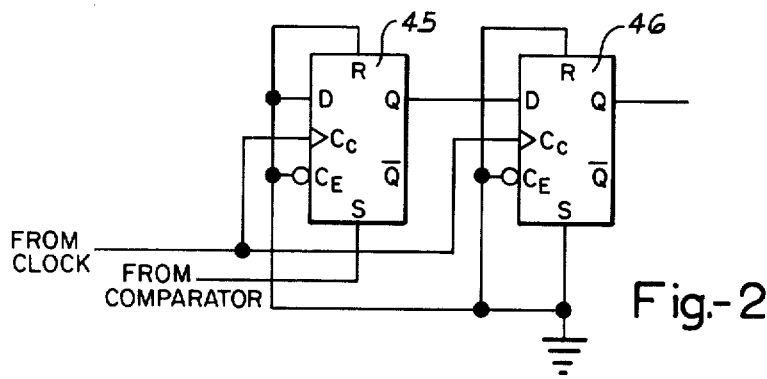
Fig.-2
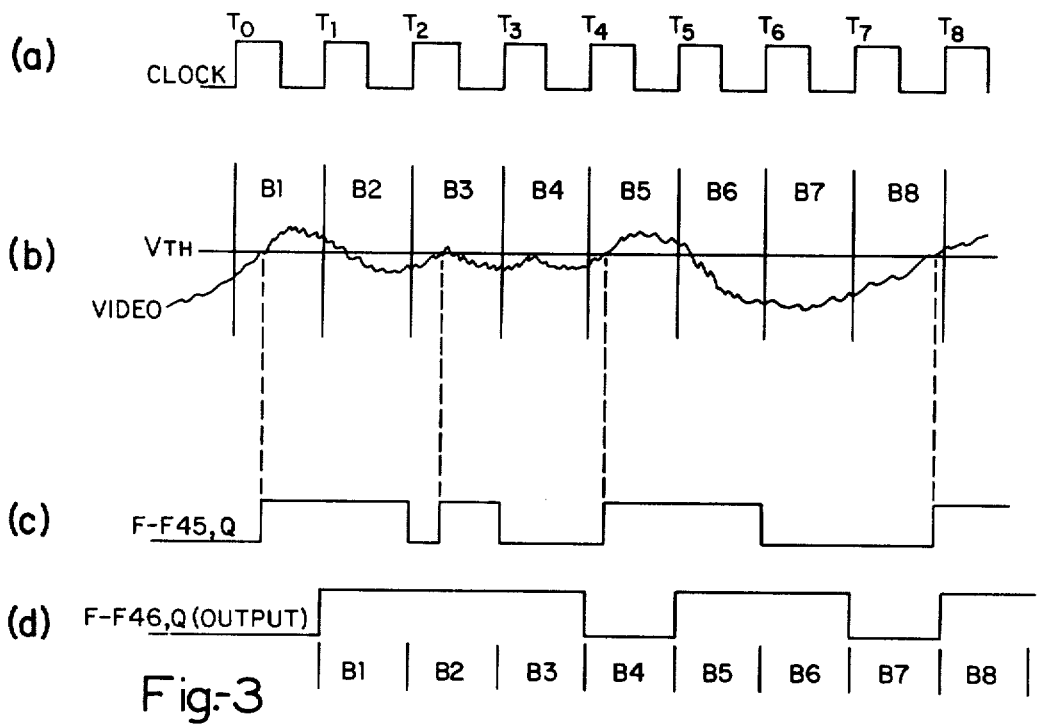
Fig.-3
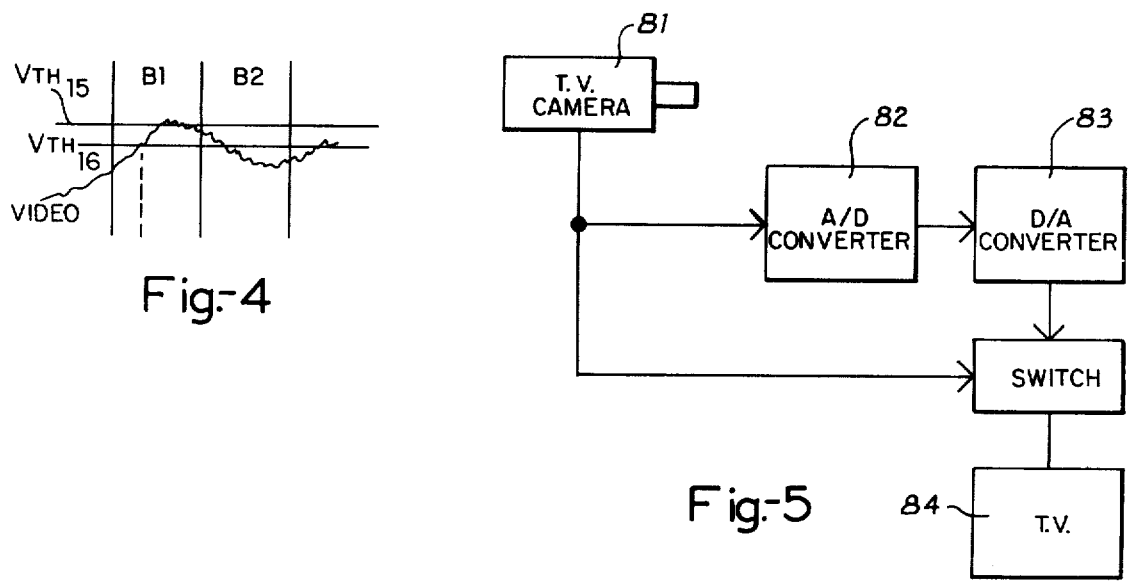
Fig.-4
Fig.-5

CONVERTER FOR CONVERTING A HIGH FREQUENCY VIDEO SIGNAL TO A DIGITAL SIGNAL

BACKGROUND OF THE INVENTION

The present invention relates to an analog-to-digital converter and more particularly to a converter for converting a high frequency video signal to a digital signal by peak detecting the video input voltage during sample times.

The prior art in respect to analog-to-digital conversion in general, is voluminous. Most of the known conversion devices include triggered circuitry such as flip-flops, counters, and the like, however heretofore available converts can process only analog signal less than 1 MH$_z$. Also, there are no heretofore known converters which have peak detecting capability.

One device for converting an analog signal to a binary signal is shown and described in U.S. Pat. No. 3,859,631, entitled, "Method And Apparatus For Decoding Binary Digital Signals", which issued Jan. 7, 1975, to Robert S. Holmes and Walter M. Katz. In this patented device, a phase lock loop is provided for locking the operation of a counter onto a multiple of the bit frequency. The counter is preset at the start of each bit and logic circuitry is provided for causing the counter to operate in a predetermined manner depending upon the level of the signal in the bit cell and whether that signal is in the first or the second half of the bit cell. The value of the cell is either a one or zero depending upon the contents of the counter at the end of the bit cell as determined by the phase lock loop.

SUMMARY OF THE INVENTION

The present invention relates to a high frequency analog-to-digital converter by peak detecting the voltages of the input signal. A video input signal fans out to a plurality of comparators which are connected with a resistive ladder. The outputs from the comparators go to a plurality of master-slave flip-flops. Real time is divided into sampling bins determined by the cycle time of a clock and, within each bin, the digital output from the flip-flops shows the maximum level reached by a video input signal. The outputs from the flip-flops go to a pair of priority encoders and a multiplexer for recording in digital form the highest point reached on the resistive ladder.

It is therefore a general object of the present invention to provide a device for converting a high frequency video signal to a digital signal.

Another object of the present invention is to provide an analog-to-digital converter which is peak detecting.

Other objects, advantages and novel features of the present invention will become apparent from the following detailed description of the invention when considered in conjunction with the accompanying drawings.

BRIEF DESCRIPTION OF THE DRAWINGS

FIG. 2 is a schematic block diagram of one master-slave flip-flop;

FIGS. 3a–d show waveform diagrams explanatory of the operation of the preferred embodiment of the present invention;

FIG. 4 is a waveform diagram showing a video input signal being compared with two threshold voltage levels; and FIG. 5 is a block diagram of a test set-up showing the feasibility of the present invention.

DESCRIPTION OF THE PREFERRED EMBODIMENT

Figure 1:
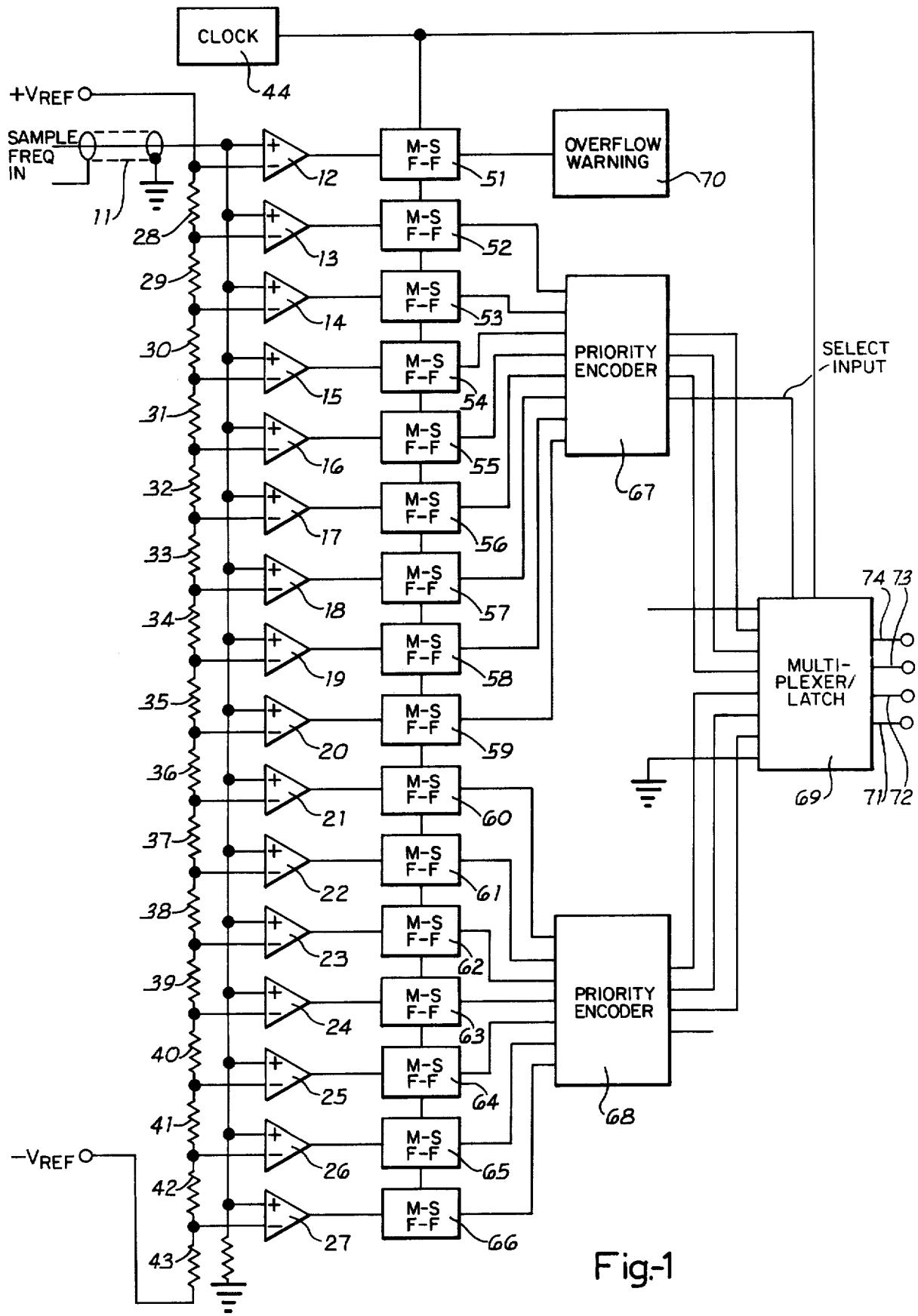
FIG. 1 is a schematic block diagram of a preferred embodiment of the present invention.

Referring now to the drawings, a video input signal comes in on a 75 ohm coaxial cable 11 and fans out to sixteen comparators which have been numbered 12 through 27. Sixteen resistors 28 through 43 of equal value form a resistive ladder for the sixteen comparators. One end of the resistive ladder is connected to a positive voltage reference and the other end of the resistive ladder is connected to a negative voltage reference. These two voltages can be raised or lowered independently of each other in order to place the signal level within its bounds.

As shown in FIG. 3 of the drawings, real time is divided into sampling bins which are determined by the cycle time of clock 44. The bin size, B, is equal to one clock period as shown in FIGS. 3(a) and 3(b). Within each bin, the digital output shows the maximum level reached by the video input signals. This determination of maximum level is made by a pair of master-slave flip-flops 45 and 46 of which a pair are connected to the output of each comparator. By way of example, flip-flops 45 and 46 might be integrated circuits which can be procured from Motorola Semiconductor Products, Inc., Phoenix, Arizona, under the designation MC10131. The MC10131 is a dual master-slave Type D flip-flop. Asynchronous Set (S) and Reset (R) override Clock ($C_C$) and $\overline{\text{Clock Enable}}$ ($\overline{C_E}$) inputs. Each flip-flop may be clocked separately by holding the common clock in the low state and using the enable inputs for the clocking function. If the common clock is to be used to clock the flip-flop, the $\overline{\text{Clock Enable}}$ inputs must be in the low state. In this case, the enable inputs perform the function of controlling the common clock. The output states of the flip-flop can only change on the positive transition of the clock. A change in the information present at the data (D) input will not affect the output information at any other time due to master-slave construction.

Referring again to the timing diagram shown in FIG. 3 of the drawings, it can be seen that at time $T_0$, Clock 44 transfers D=0 to the output of flip-flop 45. As shown in FIG. 3(b), while still within bin $B_1$, the video input signal exceeds the threshold level ($V_{TH}$) and flip-flop 45 is then set by the high output from a comparator. By way of example, the threshold voltage level ($V_{TH}$) shown in FIG. 3(b) might be the threshold voltage level set by comparator 16 and, accordingly four higher threshold voltage levels will be set by comparators 12 through 15, and eleven lower threshold voltage levels will be set by comparators 17 through 27. At time $T_1$, the output from comparator 16 would still be high, as the video input voltage is higher than the threshold voltage level so, Q of flip-flop 45 remains high due to the overriding effect of the S input.

FIG. 3(c) shows that the output of flip-flop 45 stays high for the rest of the clock cycle. For example, even though the video input voltage dropped below the threshold voltage level ($V_{TH}$) in bin $B_2$, FIG. 3(c) shows that the Q of flip-flop 45 remains high. Likewise, FIGS. 3(b) and 3(c) show that at the start of bin $B_3$ the video input voltage was below the threshold voltage level ($V_{TH}$) but then peaked above the threshold voltage level for a moment and then again dropped below the threshold voltage level.

Flip-flop 46 is used to resynchronize the output of flip-flop 45 with the clock so that the output of flip-flop 45 is stable for a whole clock period. For example, comparing FIG. 3(d) with FIG. 3(b), FIG. 3(d) shows that at some time within bins $B_1$, $B_2$, $B_3$, $B_5$, $B_6$, and $B_8$, the video input signal exceeded the threshold voltage level ($V_{TH}$), and that at no time within bins $B_4$ and $B_7$ did the video input voltage exceed the threshold voltage level. It should be understood that FIG. 3(b) shows a threshold voltage level from only one comparator, such as from comparator 16, and that the same video input voltage is compared with a plurality of threshold voltage levels to determine the peaks of the input signal.

Referring now to FIG. 4 of the drawings, there is shown that in bin $B_1$ the video input signal, by way of example, exceeds the threshold voltage level set by comparator 16 and also exceeds the threshold voltage level set by comparator 15. The information that the input signal is greater than the threshold voltage level set by comparator 16 is no longer pertinent as the peak voltage level reached is to be ascertained. Consequently, the outputs from master-slave flip-flops 52 through 59 are fed to a first priority encoder 67 and the outputs from master-slave flip-flops 60 through 66 are fed to a second priority encoder 68. These priority encoders select only the high or peak voltage information and discard the other non-pertinent information. By way of example, the 8-input priority encoders 67 and 68 can be procured from Motorola Semiconductor Products, Inc., Phoenix, Arizona, under the designation MC10165. The MC10165 is a device designed to encode eight inputs to a binary coded output. The output code is that of the highest order input. Any input of lower priority is ignored. The following is the TRUTH TABLE for the MC10165:

TRUTH TABLE

| DATA INPUTS | | | | | | | | OUTPUTS | | | |
|---|---|---|---|---|---|---|---|---|---|---|---|
| D0 | D1 | D2 | D3 | D4 | D5 | D6 | D7 | Q3 | Q2 | Q1 | Q0 |
| H | φ | φ | φ | φ | φ | φ | φ | H | L | L | L |
| L | H | φ | φ | φ | φ | φ | φ | H | L | L | H |
| L | L | H | φ | φ | φ | φ | φ | H | L | H | L |
| L | L | L | H | φ | φ | φ | φ | H | L | H | H |
| L | L | L | L | H | φ | φ | φ | H | H | L | L |
| L | L | L | L | L | H | φ | φ | H | H | L | H |
| L | L | L | L | L | L | H | φ | H | H | H | L |
| L | L | L | L | L | L | L | H | H | H | H | H |
| L | L | L | L | L | L | L | L | L | L | L | L |

φ = Don't Care

As 16 comparators 12 through 27 are used in the preferred embodiment of the invention, two 8-input priority encoders are required and 8 inputs are fed to encoder 67 and 7 inputs are fed to encoder 68. The outputs from encoders 67 and 68 are combined in multiplexer/latch 69. By way of example, multiplexer/latch 69 can be procured from Motorola Semiconductor Products, Inc., Phoenix, Arizona, under the designation MC10173. The MC10173 is a quad two channel multiplexer with latch that incorporates common clock and common data select inputs. A select input determines which four data inputs are enabled, that is, a high level enables four data inputs and a low level enables four other inputs. This select input is provided from priority encoder 67 and sets the multiplexer to accept either the outputs from priority encoder 67 or 68. As the device herein described operates on peak detection, any information supplied by FF51 through 59 will cause all information going to priority encoder 68 to be nonpertinent. Likewise, if FF51 through 59 do not supply any information to priority encoder 67 then the select input to multiplexer latch 69 will switch to accept the outputs from priority encoder 68. Multiplexer/latch 69 has four outputs 71 through 74 which provide, in inverted digital logic form a representation of the video input voltage being converted.

Comparator 12 sets the highest threshold level ($V_{TH}$) and this level should be of sufficient value so that the video input voltage does not exceed this level. In the event that this highest threshold level is exceeded then master-slave flip-flop 51 will provide an output which is fed to an overflow warning device 70 to indicate that the peak voltages are not being detected and that the outputs from multiplexer 69 do not represent true digital values of the video input voltage. $+V_{RFF}$ and/or $-V_{RFF}$ must be adjusted so that the highest peak voltage of the video input voltage can be detected.

In actuality, the outputs, in digital form, from multiplexer 69, are samples of the video input signal. The use of ECL circuitry, however, permits the present analog-to-digital converter to operate extremely fast (75-80 $MH_z$) and a good representation of the video input voltage is obtained.

FIG. 5 of the drawings shows a test apparatus which was used at the Naval Avionics Facility, Indianapolis, for verifying the operation of the embodiment of the invention shown in FIG. 1 of the drawings. A signal from a camera 81 could be passed through the A/D converter 82 of the present invention and then converted back by a D/A converter 83 and viewed by monitor 84. The picture on monitor 84 was very clear. The signal from camera 81 could then be switched to by-pass the A/D converter 82 and the D/A converter 83 and go straight to the monitor 84. The two pictures produced were indistinguishable from one another.

It can thus be seen that the present invention provides a novel device for converting a high frequency video signal to a digital signal by detecting the peaks of the video signal.

Obviously many modifications and variations of the present invention are possible in the light of the above teachings. It is therefore to be understood that the invention may be practiced otherwise than as specifically described.

We claim:

1. A high speed peak-detecting analog-to-digital converter comprising,
    an analog voltage signal,
    a plurality of voltage comparators each having an output terminal and having an input connected to said analog voltage signal,
    first means for providing a different threshold voltage to each said comparator, each said comparator providing an output signal at said output terminal whenever the voltage value of said analog voltage signal exceeds said threshold voltage being applied to a particular comparator,
    clock pulse generating means,
    second means connected with said output terminals and triggered by said clock pulse generating means for continuously sampling said analog voltage signal and providing an output signal for each comparator whose threshold voltage is lower than the voltage value of the sampled analog voltage signal, first and second priority encoders connected with said second means for encoding each threshold voltage which is lower in value than the voltage value of the sampled analog voltage signal and providing a digital output denoting the highest threshold voltage which was exceeded by the sampled analog voltage, and a multiplexer connected with said first and second priority encoders for accepting the digital output of said first priority encoder when said second priority encoder does not provide a digital output and for accepting only the digital output of said second priority encoder when said second priority encoder provides an output and providing a digital output which is representative of the highest threshold voltage which was exceeded by the sampled analog voltage.

2. A high speed peak-detecting analog-to-digital converter as set forth in claim 1 wherein said first means is a voltage divider having substantially linear characteristics.

3. A high speed peak-detecting analog-to-digital converter as set forth in claim 1 having means for indicating that the highest threshold voltage level provided is too low.

4. A high speed peak detecting analog-to-digital converter comprising, an analog voltage signal to be converted to digital form, a voltage divider having a plurality of series connected resistors for providing a plurality of threshold voltages, a plurality of comparators equal in number to the number of resistors of said voltage divider each having first and second input terminals, each said comparator having one input terminal connected to said analog voltage signal and the other said input terminal connected to one end of a different resistor in said voltage divider, a plurality of master-slave flip-flops connected one each to an output of said comparators, clock pulse generating means for triggering said master-slave flip-flops to continuously sample said analog voltage signal, first and second priority encoders connected with said plurality of master-slave flip-flops for encoding each threshold voltage which is lower in value than the voltage value of the sampled analog voltage signal and providing a digital output denoting the highest threshold voltage which was exceeded by the sampled analog voltage, and a multiplexer connected with said first and second priority encoders for accepting the digital output of said first priority encoder when said second priority encoder does not provide a digital output and for accepting only the digital output of said second priority encoder when said second priority encoder provides an output and providing a digital output which is representative of the highest threshold voltage which was exceeded by the sampled analog voltage.

5. A high speed peak-detecting analog-to-digital converter as set forth in claim 4 wherein said voltage divider has a substantially linear characteristic.

6. A high speed peak-detecting analog-to-digital converter as set forth in claim 4 having means for applying a constant voltage across said voltage divider.

7. A high speed peak-detecting analog-to-digital converter as set forth in claim 4 having means for indicating that the highest threshold voltage level provided is too low.

* * * * *